US008008782B2

(12) United States Patent
Kageyama

(10) Patent No.: US 8,008,782 B2
(45) Date of Patent: Aug. 30, 2011

(54) SEMICONDUCTOR DEVICE

(75) Inventor: Satoshi Kageyama, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 12/801,388

(22) Filed: Jun. 7, 2010

(65) Prior Publication Data

US 2010/0244264 A1 Sep. 30, 2010

Related U.S. Application Data

(63) Continuation of application No. 12/230,618, filed on Sep. 2, 2008, now Pat. No. 7,750,480.

(30) Foreign Application Priority Data

Sep. 3, 2007 (JP) ................................ 2007-228034

(51) Int. Cl.
*H01L 23/522* (2006.01)

(52) U.S. Cl. ................. 257/774; 257/758; 257/E23.145

(58) Field of Classification Search .................. 257/774, 257/758, E23.145

See application file for complete search history.

(56) References Cited

U.S. PATENT DOCUMENTS

| | | | | |
|---|---|---|---|---|
| 6,489,684 | B1 | 12/2002 | Chen et al. | 257/774 |
| 7,301,236 | B2 | 11/2007 | Greco et al. | 257/758 |
| 7,459,787 | B2 * | 12/2008 | Young | 257/758 |
| 7,547,584 | B2 * | 6/2009 | Chen et al. | 438/128 |
| 7,767,570 | B2 * | 8/2010 | Chen et al. | 438/597 |
| 2004/0113238 | A1 | 6/2004 | Hasunuma et al. | |
| 2005/0255650 | A1 | 11/2005 | Hasunuma et al. | |
| 2007/0108618 | A1 | 5/2007 | Hasunuma et al. | |

FOREIGN PATENT DOCUMENTS

JP 2004-119969 4/2004

* cited by examiner

*Primary Examiner* — Roy K Potter

(74) *Attorney, Agent, or Firm* — Rabin & Berdo, PC

(57) ABSTRACT

A semiconductor device including a first wire made of a material mainly composed of Cu, two second wires made of a material mainly composed of Cu, an interlayer dielectric film formed between the first wire and the two second wires, two vias made of a material mainly composed of Cu and each penetrating through the interlayer dielectric film and connecting the first wire and a respective one of the two second wires, and a dummy via formed between the two second wires. The dummy via is made of a material mainly composed of Cu, has a diameter smaller than a diameter of each of the two vias, and is connected to the first wire while not contributing to electrical connection between the first wire and the two second wires.

7 Claims, 3 Drawing Sheets

8a 11a 9a 14a 13 15 14b 9b 11b 8b 12a 10 12b 7 6 5 4 2 16 3

1

12b
7
6
5
4
2
8b
3
11b
9b
14b
15
13
16
1
10
14a
9a
11a
8a
12a 47
53
46
42
48
50
56
43
41
51
49
45
44
54
52

SEMICONDUCTOR DEVICE

CROSS-REFERENCE TO RELATED APPLICATIONS

This application is a continuation of application Ser. No. 12/230,618, filed on Sep. 2, 2008. This application claims the benefit of priority of Japanese application 2007-228034, filed Sep. 3, 2007. The disclosures of these prior U.S. and Japanese applications are incorporated herein by reference.

BACKGROUND OF THE INVENTION

1. Field of the Invention

The present invention relates to a semiconductor device having a multilayer interconnection structure.

2. Description of Related Art

The so-called multilayer interconnection structure formed by stacking a plurality of wiring layers on a semiconductor substrate is applied to an LSI having a high degree of integration, for example. In this multilayer interconnection structure, Cu (copper) having higher conductivity is increasingly employed as a wiring material for reducing wiring resistance, in place of generally employed Al (aluminum).

In a multilayer interconnection structure (Cu interconnection structure) employing Cu as the wiring material, a first groove is dug in a first interlayer dielectric film made of $SiO_2$ (silicon oxide) from the upper surface thereof, and a lower wire made of Cu is embedded in this first groove. A barrier film for preventing diffusion of Cu into the dielectric film is formed between the lower wire and the first interlayer dielectric film. Ta (tantalum) or TaN (tantalum nitride), for example, can be employed as the material for the barrier film. In other words, the lower wire made of Cu is embedded in the first groove formed in the first interlayer dielectric film through the Ta-based barrier film.

An SiC film made of SiC (silicon carbide) having barrier properties against diffusion of Cu is formed on the first interlayer dielectric film and the lower wire. A second interlayer dielectric film made of $SiO_2$ is formed on the SiC film. A second groove is dug in the second interlayer dielectric film from an upper surface thereof. A via hole reaching an upper surface of the lower wire from a bottom surface of the second groove is penetratingly formed in the second interlayer dielectric film and the SiC film. Inner surfaces of the second groove and the via hole and a portion of the lower wire facing the via hole are covered with a Ta-based barrier film, so that an upper wire made of Cu is embedded in the second groove and a via made of Cu is embedded in the via hole through the barrier film respectively. Thus, the upper wire and the lower wire are electrically connected with each other through the barrier film provided between the bottom surfaces of the via hole and the via and the upper wire.

When stress is applied to the Cu interconnection structure, however, the so-called SIV (Stress Induced Voiding) may be caused to form a void (intra-via void) on a bottom portion of the via or to form a void (under-via void) immediately under the via in the lower wire made of Cu. If SIV progresses to remarkably grow the intra-via void or the under-via void, the electrical connection between the upper wire and the lower wire is disadvantageously cut.

SUMMARY OF THE INVENTION

An object of the present invention is to provide a semiconductor device capable of preventing disconnection of a via.

A semiconductor device according to one aspect of the present invention includes: a first wire made of a material mainly composed of Cu; a second wire made of a material mainly composed of Cu; an interlayer dielectric film formed between the first wire and the second wire; a via, made of a material mainly composed of Cu, penetrating through the interlayer dielectric film to be connected to the first wire and the second wire; and a dummy via, made of a material mainly composed of Cu, smaller in via diameter than the via and connected to the first wire while not contributing to electrical connection between the first wire and the second wire.

According to this structure, the first wire and the second wire made of the materials mainly composed of Cu are formed through the interlayer dielectric film. The first wire and the second wire are electrically connected with each other by the via made of the material mainly composed of Cu. The dummy via made of the material mainly composed of Cu is connected to the first wire. The dummy via does not contribute to the electrical connection between the first wire and the second wire. The dummy via is smaller in via diameter than the via.

SIV is easily caused as the via diameter is reduced. Therefore, a void resulting from SIV is more easily formed on a bottom portion of the dummy via or immediately under the same as compared with the via. The void is formed on the bottom portion of the dummy via or immediately under the same, thereby preventing voiding on the bottom portion of the via or immediately under the same. Consequently, disconnection of the via can be prevented, and wiring reliability can be improved. The dummy via does not contribute to the electrical connection between the first wire and the second wire, and hence the void formed on the bottom portion of the dummy via or immediately under the same exerts no influence on the electrical connection between the first wire and the second wire.

The first wire may be provided under the interlayer dielectric film, and the lower end of the dummy via may be connected to an upper surface of the first wire.

According to this structure, the first wire is provided under the second wire through the interlayer dielectric film. The via and the dummy via are connected to the upper surface of the first wire. Therefore, the first wire can be prevented from voiding in a portion located immediately under the via, due to the provision of the dummy via.

The first wire may be provided above the interlayer dielectric film, and an upper end of the dummy via may be connected to an lower surface of the first wire.

According to this structure, the first wire is provided above the second wire through the interlayer dielectric film. The via and the dummy via are connected to the lower surface of the first wire. Therefore, voiding on the bottom portion of the via can be prevented, due to the provision of the dummy via.

If a plurality of vias are provided, the dummy via is preferably provided correspondingly to each via.

According to this structure, SIV resulting from stress applied to a portion around each via can be caused in the dummy via provided correspondingly to each via. Consequently, voiding on the bottom portion of each via or immediately under the same can be excellently prevented.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
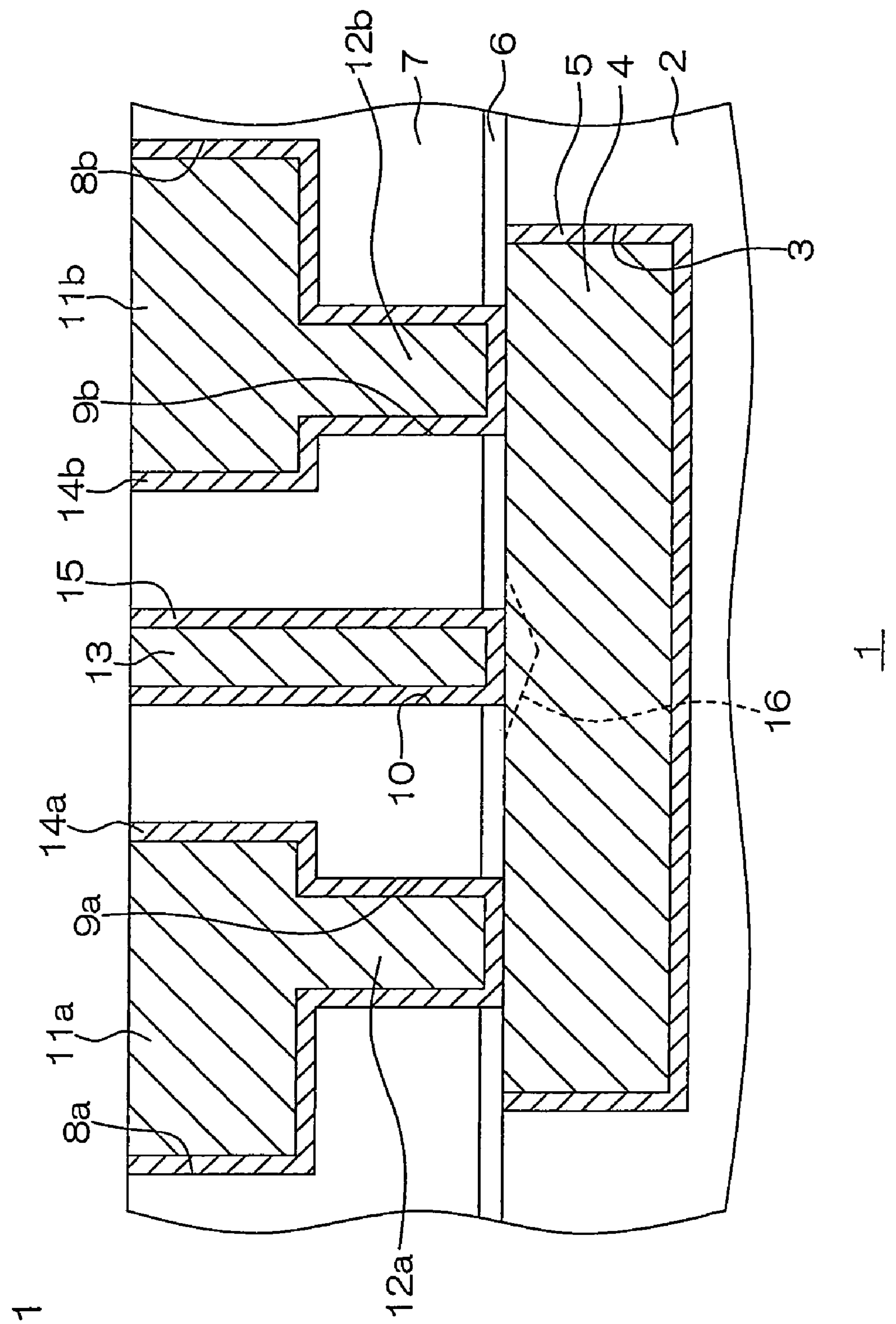
FIG. 1 is a schematic sectional view of a semiconductor device according to a first embodiment of the present invention.

FIG. 1 is a schematic sectional view of a semiconductor device according to a first embodiment of the present invention.

Figure 2:
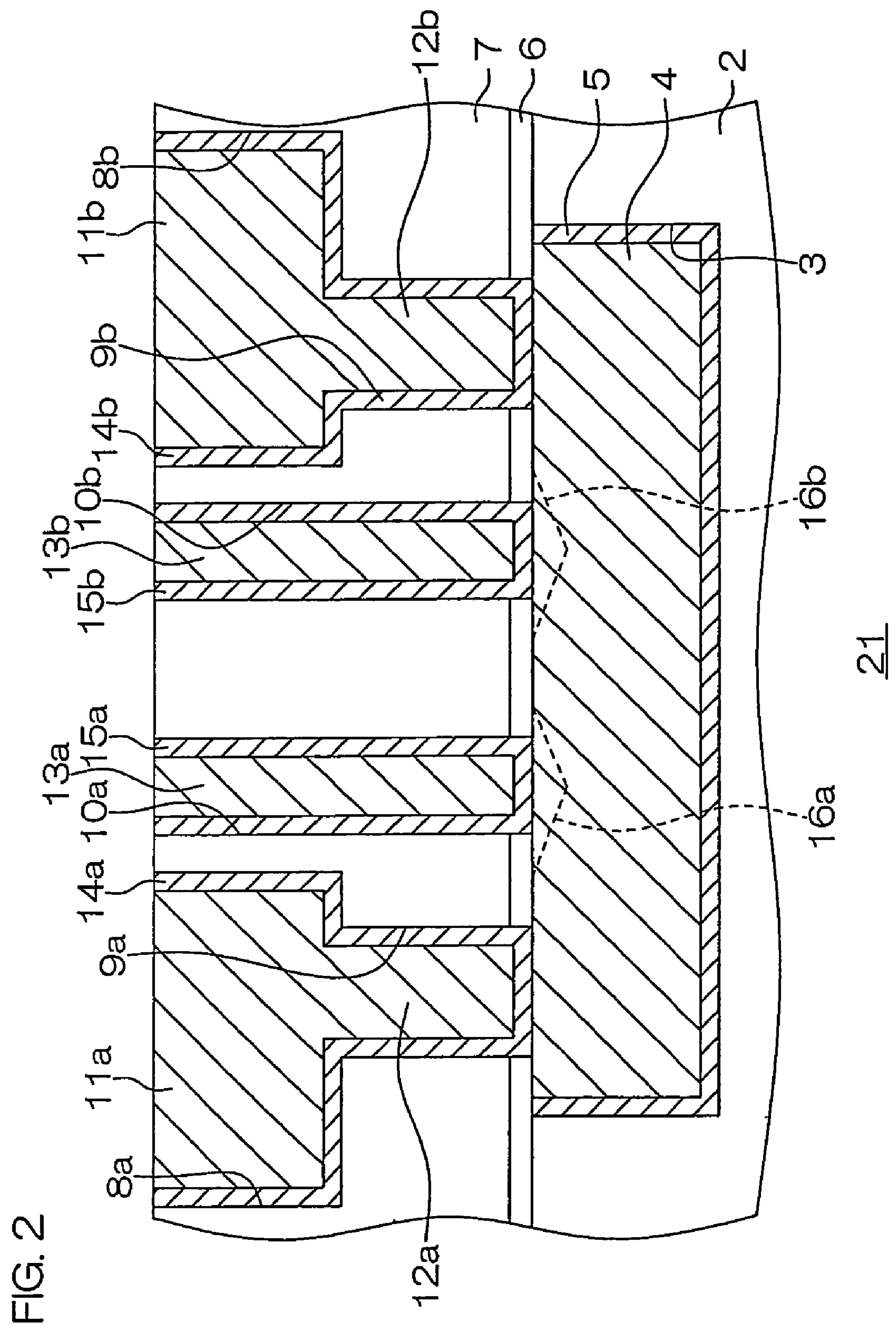
FIG. 2 is a schematic sectional view of a semiconductor device according to a second embodiment of the present invention.
Figure 3:
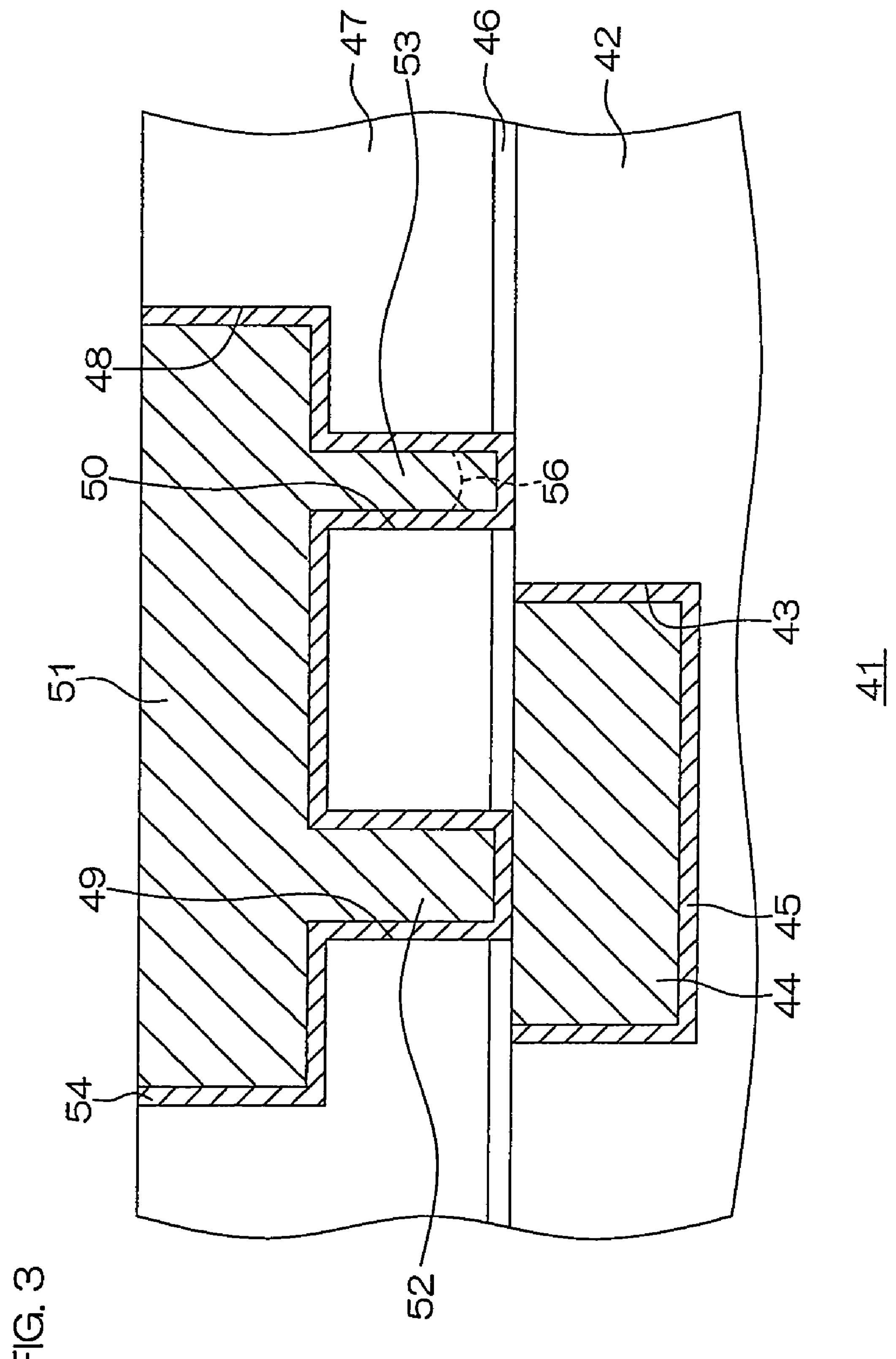
FIG. 3 is a schematic sectional view of a semiconductor device according to a third embodiment of the present invention.

Referring to FIGS. 1 to 3, portions other than those made of conductive materials are not hatched, in order to avoid complication of the illustrations.

In the semiconductor device 1, a first interlayer dielectric film 2 made of $SiO_2$ is laminated on a semiconductor substrate (not shown).

A first groove 3 is dug in the first interlayer dielectric film 2 from an upper surface thereof. A lower wire 4 made of Cu as a first wire is embedded in the first groove 3. A side surface and a bottom surface of the lower wire 4 are covered with a barrier film 5. The barrier film 5 is made of a Ta-based material having barrier properties against diffusion of Cu, for example. Ta or TaN can be illustrated as an example of the Ta-based material (this also applies to the following description).

An SiC film 6 made of SiC is laminated on the first interlayer dielectric film 2 and the lower wire 4. SiC has barrier properties against diffusion of Cu.

A second interlayer dielectric film 7 made of $SiO_2$ is laminated on the SiC film 6.

Two second grooves 8*a* and 8*b* are dug in the second interlayer dielectric film 7 from an upper surface thereof, on positions opposed to the first groove 3 in the thickness direction. Upper wires 11*a* and 11*b* made of Cu as second wires are embedded in the second grooves 8*a* and 8*b* respectively.

A via hole 9*a* is formed between the lower wire 4 and the upper wire 11*a*, to penetrate through the SiC film 6 and the second interlayer dielectric film 7. Another via hole 9*b* is formed between the lower wire 4 and the upper wire 11*b*, to penetrate through the SiC film 6 and the second interlayer dielectric film 7. Vias 12*a* and 12*b* made of Cu are provided in the via holes 9*a* and 9*b* respectively.

An upper end of the via 12*a* is connected to a bottom surface of the upper wire 11*a*. A barrier film 14*a* is continuously formed between the upper wire 11*a* and the second groove 8*a*, between the via 12*a* and an inner surface of the via hole 9*a* and between the via 12*a* and the lower wire 4. The barrier film 14*a* is made of a Ta-based material. In other words, the barrier film 14*a* made of the Ta-based material continuously covers the bottom surface and a side surface of the upper wire 11*a* and a bottom surface and a side surface of the via 12*a*. A lower end of the via 12*a* is connected to the lower wire 4 through the barrier film 14*a*.

An upper end of the via 12*b* is connected to a bottom surface of the upper wire 11*b*. A barrier film 14*b* is continuously formed between the upper wire 11*b* and the second groove 8*b*, between the via 12*b* and an inner surface of the via hole 9*b* and between the via 12*b* and the lower wire 4. The barrier film 14*b* is made of a Ta-based material. In other words, the barrier film 14*b* made of the Ta-based material continuously covers the bottom surface and the side surface of the upper wire 11*b* and the bottom surface and a side surface of the via 12*b*. A lower end of the via 12*b* is connected to the lower wire 4 through the barrier film 14*b*.

On the lower wire 4, a dummy via hole 10 is formed between the upper wires 11*a* and 11*b* (between the second grooves 8*a* and 8*b*), to penetrate through the SiC film 6 and the second interlayer dielectric film 7. The dummy via hole 10 has a smaller diameter than the via holes 9*a* and 9*b*.

A dummy via 13 made of Cu is provided in the dummy via hole 10. A diameter (via diameter) of the dummy via 13 corresponds to the diameter of the dummy via hole 10, and is smaller than via diameters of the vias 12*a* and 12*b*.

A side surface and a bottom surface of the dummy via 13 are covered with a barrier film 15. The barrier film 15 is made of a Ta-based material. A lower end of the dummy via 13 is connected to the lower wire 4 through the barrier film 15. On the other hand, an upper end of the dummy via 13 is connected to the upper wires 11*a* and 11*b*. The dummy via 13 does not contribute to electrical connection between the upper wires 11*a* and 11*b* and the lower wire 4.

Thus, the dummy via 13 of Cu not contributing to the electrical connection between the lower wire 4 and the upper wires 11*a* and 11*b* is connected to the upper surface of the lower wire 4. The dummy via 13 is smaller in via diameter than the vias 12*a* and 12*b*. SIV is easily caused as the via diameter is reduced. Therefore, a void resulting from SIV is more easily formed immediately under the dummy via 13 as compared with the vias 12*a* and 12*b*. As shown by broken lines in FIG. 1, a void 16 is so formed immediately under the dummy via 13 as to prevent voiding immediately under the vias 12*a* and 12*b*. Consequently, disconnection of the vias 12*a* and 12*b* can be prevented, and wiring reliability can be improved. The dummy via 13 does not contribute to the electrical connection between the lower wire 4 and the upper wires 11*a* and 11*b*, and hence the void 16 formed immediately under the dummy via 13 exerts no influence on the electrical connection between the lower wire 4 and the upper wires 11*a* and 11*b*.

FIG. 2 is a schematic sectional view showing the structure of a semiconductor device according to a second embodiment of the present invention. Referring to FIG. 2, portions corresponding to those shown in FIG. 1 are denoted by the same reference numerals. In the following, redundant description is omitted as to the portions having the same reference numerals as the above.

In the semiconductor device 21 shown in FIG. 2, two dummy via holes 10*a* and 10*b* are formed on a lower wire 4, to penetrate through an SiC film 6 and a second interlayer dielectric film 7. The dummy via holes 10*a* and 10*b* are provided between upper wires 11*a* and 11*b*, in the vicinity of vias 12*a* and 12*b* respectively. The dummy via holes 10*a* and 10*b* have smaller diameters than via holes 9*a* and 9*b* respectively.

A dummy via 13*a* made of Cu is provided in the first dummy via hole 10*a*. A via diameter of the dummy via 13*a* corresponds to a diameter of the dummy via hole 10*a*, and is smaller than that of the via 12*a*. A side surface and a bottom surface of the dummy via 13*a* are covered with a barrier film 15*a*. The barrier film 15*a* is made of a Ta-based material. A lower end of the dummy via 13*a* is connected to the lower wire 4 through the barrier film 15*a*.

A dummy via 13*b* made of Cu is provided in the second dummy via hole 10*b*. A via diameter of the dummy via 13*b* corresponds to a diameter of the dummy via hole 10*b*, and is smaller than that of the via 12*b*. A side surface and a bottom surface of the dummy via 13*b* are covered with a barrier film 15*b*. The barrier film 15*b* is made of a Ta-based material. A lower end of the dummy via 13*b* is connected to the lower wire 4 through the barrier film 15*b*.

Upper ends of the dummy vias 13*a* and 13*b* are not connected to the upper wires 11*a* and 11*b*. Therefore, the dummy vias 13*a* and 13*b* do not contribute to electrical connection between the upper wires 11*a* and 11*b* and the lower wire 4.

Thus, the dummy vias 13*a* and 13*b* are provided in the semiconductor device 21 correspondingly to the vias 12*a* and 12*b* respectively. When stress is applied to a portion around the via 12*a* or 12*b*, therefore, a void 16*a* or 16*b* resulting from this stress can be formed immediately under the dummy via 13*a* or 13*b*, as shown by broken lines in FIG. 2. Consequently, voiding immediately under each via 12*a* or 12*b* can be excellently prevented.

FIG. 3 is a schematic sectional view showing the structure of a semiconductor device according to a third embodiment of the present invention.

In the semiconductor device 41 shown in FIG. 3, a first interlayer dielectric film 42 made of $SiO_2$ is laminated on a semiconductor substrate (not shown).

A first groove 43 is dug in the first interlayer dielectric film 42 from an upper surface thereof. A lower wire 44 made of Cu as a second wire is embedded in the first groove 43. A side surface and a bottom surface of the lower wire 44 are covered with a barrier film 45. The barrier film 45 is made of a Ta-based material having barrier properties against diffusion of Cu.

An SiC film 46 made of SiC is laminated on the first interlayer dielectric film 42 and the lower wire 44. SiC has barrier properties against diffusion of Cu.

A second interlayer dielectric film 47 made of $SiO_2$ is laminated on the SiC film 46.

A second groove 48 is dug in the second interlayer dielectric film 47 from an upper surface thereof, on a position opposed to the first groove 43 in the thickness direction. An upper wire 51 made of Cu as a first wire is embedded in the second groove 48.

A via hole 49 is formed between the lower wire 44 and the upper wire 51, to penetrate through the second interlayer dielectric film 47 and the SiC film 46. A via 52 made of Cu is provided in the via hole 49. A upper end of the via 52 is connected to a bottom surface of the upper wire 51.

A dummy via hole 50 is formed under the upper wire 51 on a portion not opposed to the lower wire 44 in the thickness direction, to penetrate through the second interlayer dielectric film 47 and the SiC film 46. The dummy via hole 50 has a smaller diameter than the via hole 49.

A dummy via 53 made of Cu is provided in the dummy via hole 50. A via diameter of the dummy via 53 corresponds to a diameter of the dummy via hole 50, and is smaller than that of the via 52. An upper end of the dummy via 53 is connected to the upper wire 51.

A barrier film 54 is continuously formed between the upper wire 51 and an inner surface of the second groove 48, between the via 52 and an inner surface of the via hole 49, between the via 52 and an upper surface of the lower wire 44 and between the dummy via 53 and an inner surface of the dummy via hole 50. The barrier film 54 is made of a Ta-based material. In other words, the barrier film 54 made of the Ta-based material continuously covers the side surfaces and the bottom surfaces of the upper wire 51, the via 52 and the dummy via 53. A lower end of the via 52 is connected to the lower wire 44 through the barrier film 54. On the other hand, a lower end of the dummy via 53 is not connected to the lower wire 44. Therefore, the dummy via 53 does not contribute to electrical connection between the upper wire 51 and the lower wire 44.

Thus, the dummy via 53 of Cu not contributing to the electrical connection between the lower wire 44 and the upper wire 51 is connected to the lower surface of the upper wire 51. The dummy via 53 is smaller in via diameter than the via 52. SIV is easily caused as the via diameter is reduced. Therefore, a void resulting from SIV is more easily formed on the bottom portion of the dummy via 53 as compared with the via 52. As shown by a broken line in FIG. 3, a void 56 is so formed on the bottom portion of the dummy via 53 as to prevent voiding on the bottom portion of the via 52. Consequently, disconnection of the via 52 can be prevented, and wiring reliability can be improved. The dummy via 53 does not contribute to the electrical connection between the lower wire 44 and the upper wire 51, and hence the void 56 formed on the bottom portion of the dummy via 53 exerts no influence on the electrical connection between the lower wire 44 and the upper wire 51.

While the dummy vias 13*a* and 13*b* are formed correspondingly to the vias 12*a* and 12*b* respectively in the second embodiment, not less than two dummy vias 13 may alternatively be provided correspondingly to each of the vias 12*a* and 12*b*. Thus, voiding immediately under the vias 12*a* and 12*b* can be more excellently prevented. Consequently, disconnection of the vias 12*a* and 12*b* can be more prevented, and the wiring reliability can be more improved.

While the lower wires 4 and 44, the upper wires 13 and 53, the vias 12*a*, 12*b* and 52 and the dummy vias 13, 13*a*, 13*b* and 53 are made of Cu, these elements may not be made of only Cu but may be formed by materials containing Cu as the main component.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-228034 filed with the Japan Patent Office on Sep. 3, 2007, the disclosure of which is incorporated herein by reference.

What is claimed is:

1. A semiconductor device comprising:

a first wire made of a material mainly composed of Cu;

two second wires made of a material mainly composed of Cu;

an interlayer dielectric film formed between the first wire and the two second wires;

two vias, made of a material mainly composed of Cu, each penetrating through the interlayer dielectric film and connecting the first wire and a respective one of the two second wires; and a dummy via formed between the two second wires, the dummy via being made of a material mainly composed of Cu, having a diameter smaller than a diameter of each of the two vias, and being connected to the first wire while not contributing to electrical connection between the first wire and the two second wires.

2. The semiconductor device according to claim 1, wherein the first wire is disposed under the interlayer dielectric film, and a lower end of the dummy via is connected to an upper surface of the first wire.

3. The semiconductor device according to claim 2, wherein the dummy via is connected to the first wire through a barrier film.

4. A semiconductor device comprising:

a first wire made of a material mainly composed of Cu;

two second wires made of a material mainly composed of Cu;

an interlayer dielectric film formed between the first wire and the two second wires;

a plurality of vias, made of a material mainly composed of Cu, each penetrating through the interlayer dielectric film and connecting the first wire and a respective one of the two second wires; and a plurality of dummy vias formed between the two second wires, each being made of a material mainly composed of Cu, having a diameter smaller than a diameter of each of the two vias, and being connected to the first wire while not contributing to electrical connection between the first wire and the two second wires, each of the plurality of dummy vias corresponding to one of the plurality of vias.

5. The semiconductor device according to claim 4, wherein each of the plurality of dummy vias is disposed in a vicinity of the corresponding one of the plurality of vias.

6. A semiconductor device comprising:

a first wire made of a material mainly composed of Cu;

two second wires made of a material mainly composed of Cu;

an interlayer dielectric film formed between the first wire and the two second wires;

two vias, made of a material mainly composed of Cu, each penetrating through the interlayer dielectric film and connecting the first wire and a respective one of the two second wires; and a dummy via formed between the two second wires, the dummy via being made of a material mainly composed of Cu, and being connected to the first wire while not contributing to electrical connection between the first wire and the two second wires, wherein the first wire is disposed under the interlayer dielectric film, and a lower end of the dummy via is connected to an upper surface of the first wire.

7. The semiconductor device of claim 6, wherein the dummy via is connected to the first wire through a barrier film.

* * * * *